United States Patent [19]

Haferl

[11] 4,232,254
[45] Nov. 4, 1980

[54] REGULATED DEFLECTION CIRCUIT

[75] Inventor: Peter E. Haferl, Adliswil, Switzerland

[73] Assignee: RCA Corporation, New York, N.Y.

[21] Appl. No.: 964,538

[22] Filed: Nov. 29, 1978

[51] Int. Cl.³ .............................................. H01J 29/70
[52] U.S. Cl. .................................. 315/408; 315/411; 363/96
[58] Field of Search .................... 363/27, 28, 49, 57, 363/70, 96, 135; 315/389, 408, 411

[56] References Cited

U.S. PATENT DOCUMENTS

| | | | |
|---|---|---|---|
| 3,387,201 | 6/1968 | Greenberg et al. | 363/28 |
| 3,889,156 | 6/1975 | Arya | 315/408 |
| 3,936,115 | 2/1976 | Dietz | 315/408 X |
| 3,999,102 | 12/1976 | Gent et al. | 315/408 X |
| 4,013,923 | 3/1977 | den Hollander | 315/411 |

Primary Examiner—William H. Beha, Jr.
Attorney, Agent, or Firm—Eugene M. Whitacre; Paul J. Rasmussen; Joseph J. Laks

[57] ABSTRACT

First and second resonant circuits store energy from a supply. First and second switches are respectively coupled to the first and second resonant circuits for generating resonant oscillations in the resonant circuits. A deflection circuit coupled to one of the resonant circuits has energy transferred to the deflection circuit during the resonant oscillations. A control circuit coupled to the switches varies the conduction angle overlap of the resonant oscillations in the resonant circuits for providing energy regulation.

13 Claims, 45 Drawing Figures

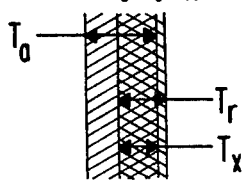

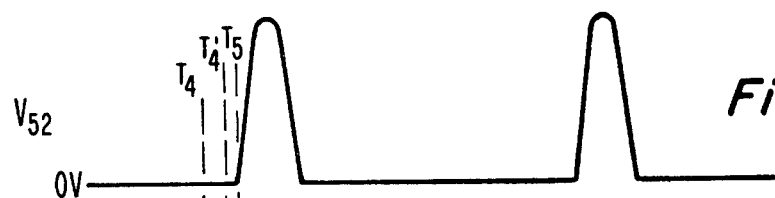
Fig.3a.
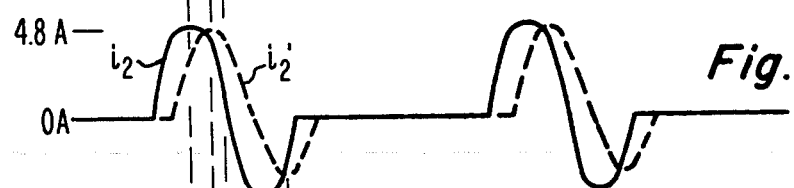
Fig.3b.
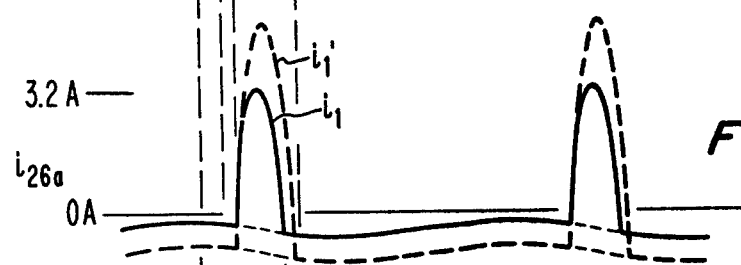
Fig.3c.
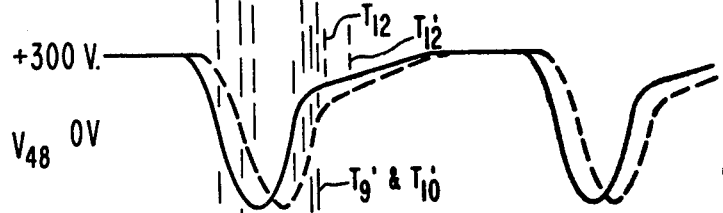
Fig.3d.
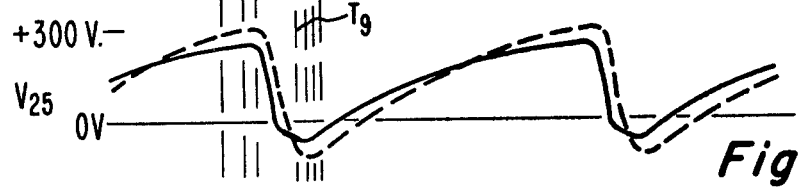
Fig.3e.
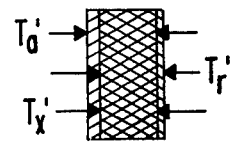
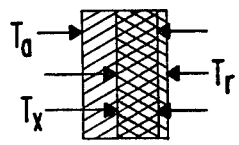

*Fig. 4a.*
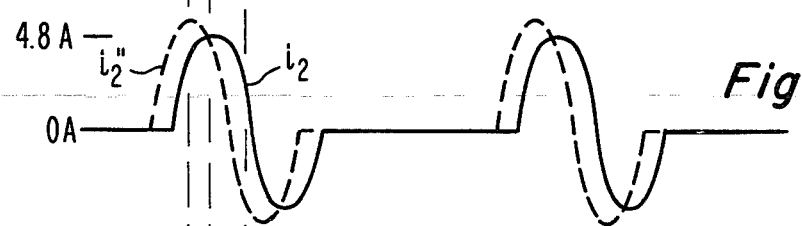
*Fig. 4b.*
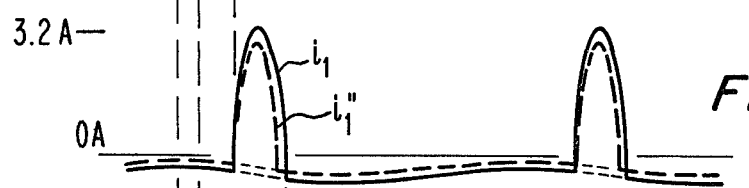
*Fig. 4c.*
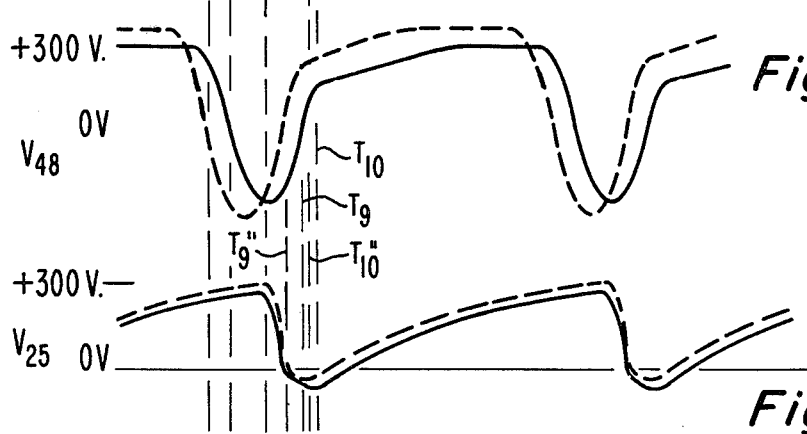
*Fig. 4d.*
*Fig. 4e.*
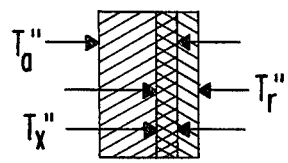
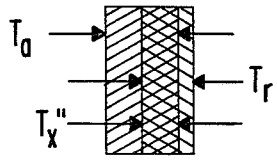

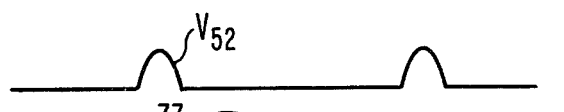
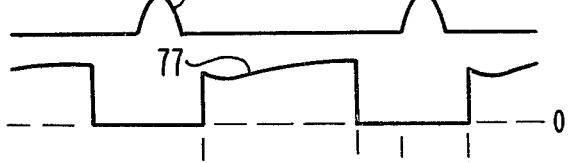
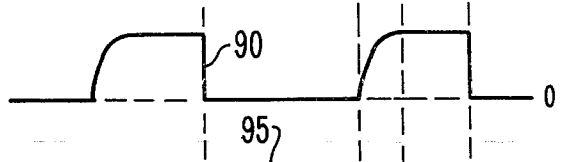
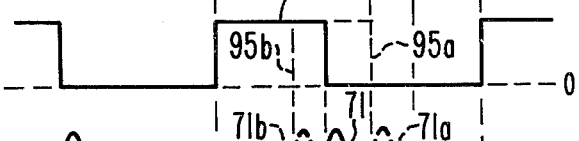
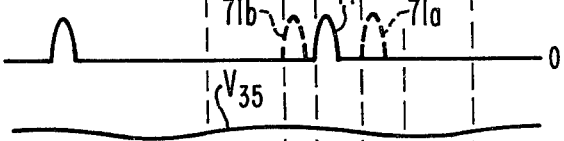
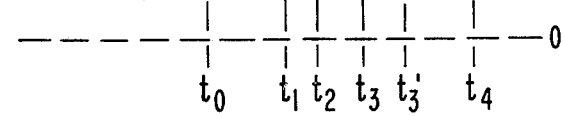
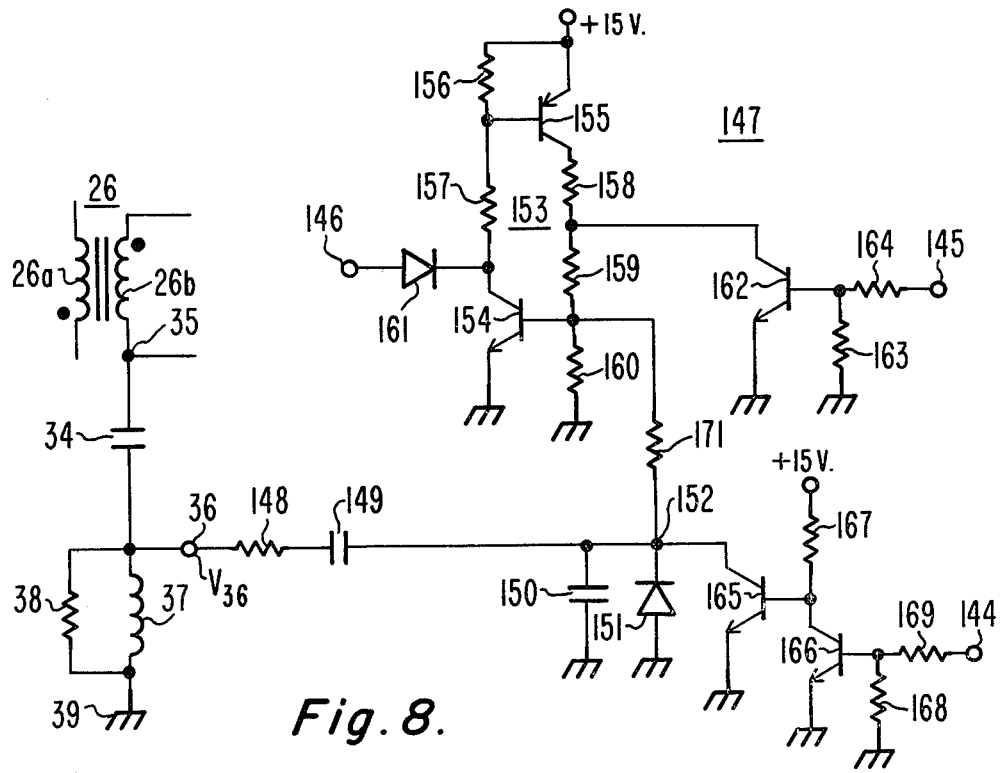

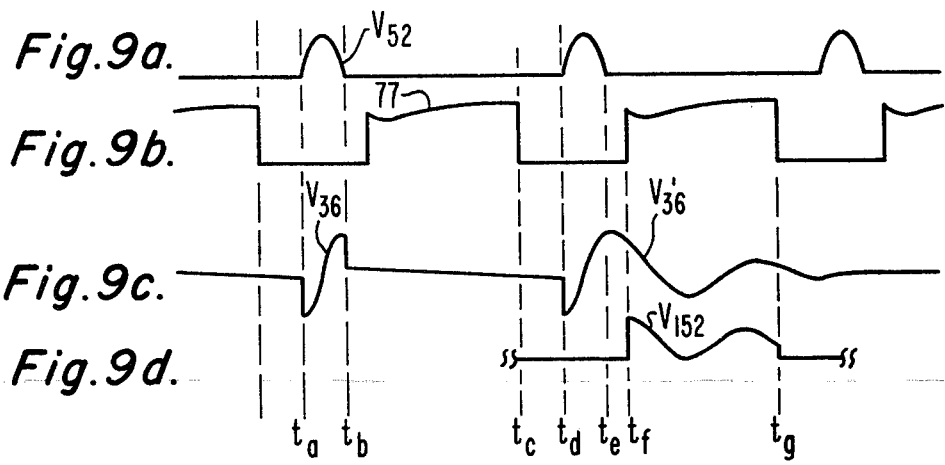
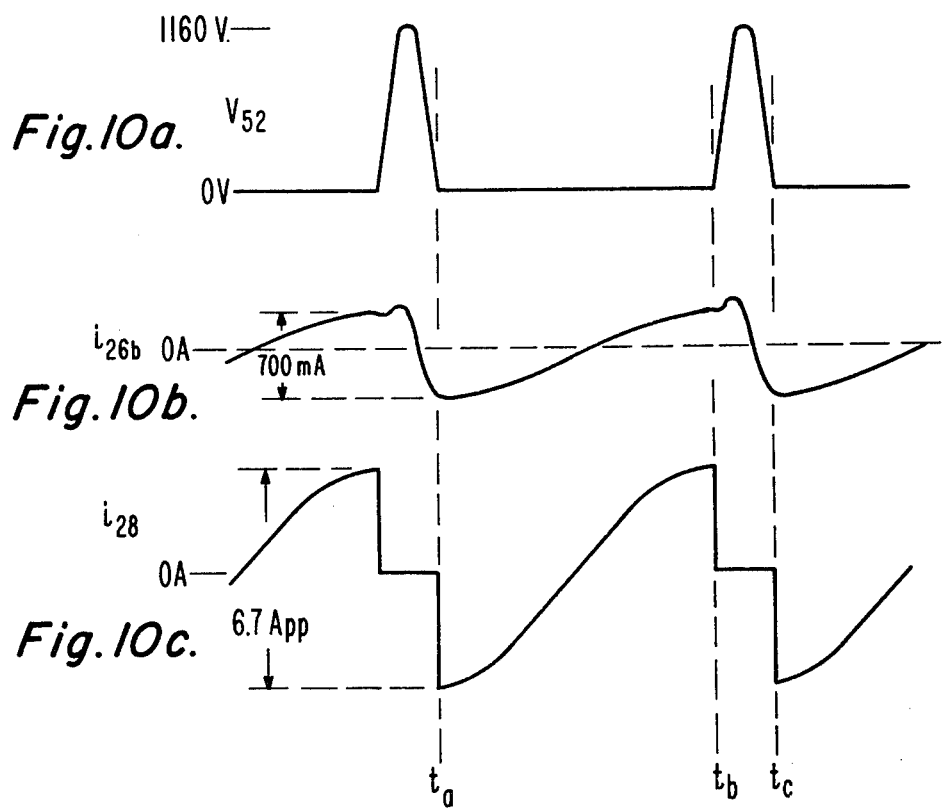

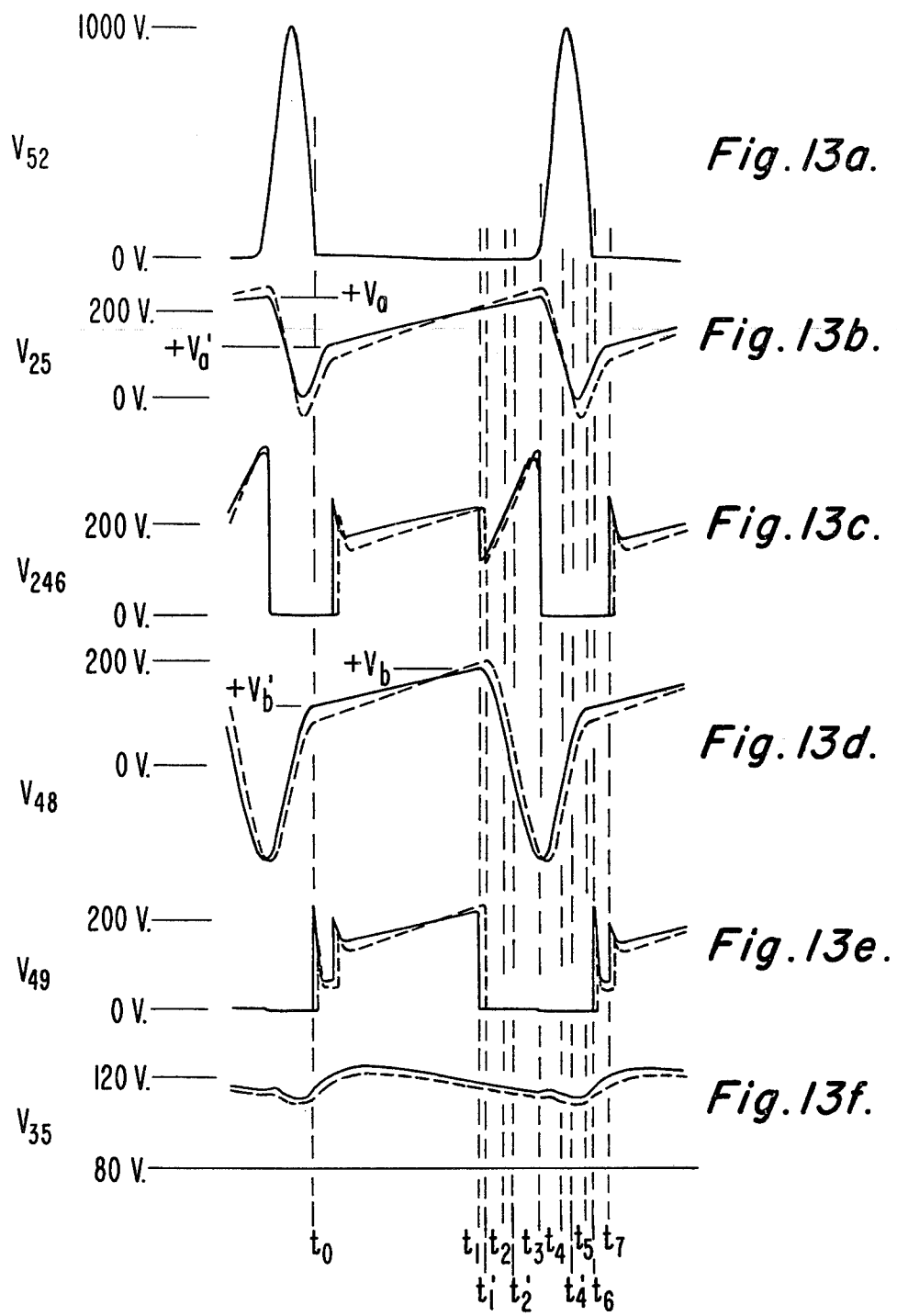

REGULATED DEFLECTION CIRCUIT

BACKGROUND OF THE INVENTION

This invention relates to a regulated power supply.

In many transistorized horizontal deflection circuits of television receivers, the horizontal output or flyback transformer transfers energy from a regulated B+ supply to the deflection circuit and other loads coupled to the flyback transformer windings. Typically the flyback transformer primary winding is DC coupled to the power supply and the trace switch. A DC load current thus flows in the primary winding, requiring a transformer core sufficiently large to prevent core saturation.

In many flyback transformers, the high voltage winding is tightly coupled to the primary winding. Short circuits in the loads coupled to the high voltage winding will produce relatively large primary winding currents. The amount of energy transfer is limited substantially only by the relatively low impedances of the power supply source, winding resistance, core losses, and leakage inductance.

When the horizontal deflection circuit is coupled to the primary winding of the flyback transformer, no electrical isolation exists between the deflection circuit and the power supply mains terminals. The deflection circuit return or ground terminal becomes a hot ground in common with one of the AC mains power supply terminals. Careful design and construction are required to avoid electrical shock hazards.

SUMMARY OF THE INVENTION

First and second resonant circuits store energy from a supply. First and second switches are respectively coupled to the first and second resonant circuits for generating resonant oscillations in the resonant circuits. A deflection circuit coupled to one of the resonants circuits has energy transferred to the deflection circuit during the resonant oscillations. A control circuit coupled to the switches varies the conduction angle overlap of the resonant oscillations in the resonant circuits for providing energy regulation.

BRIEF DESCRIPTION OF THE DRAWING

FIGS. 2a–4e illustrate waveforms associated with the circuit of FIG. 1;

FIGS. 7a–7f illustrate waveforms associated with the circuit of FIG. 6;

FIG. 8 illustrates an embodiment of the disabling circuit of FIG. 6;

FIGS. 9a–9d illustrate waveforms associated with the circuit of FIG. 8;

FIGS. 10a–10c illustrate other waveforms associated with the circuit of FIG. 1;

FIGS. 12a–13f illustrate waveforms associated with the circuit of FIG. 11.

DESCRIPTION OF THE INVENTION

Figure 1:
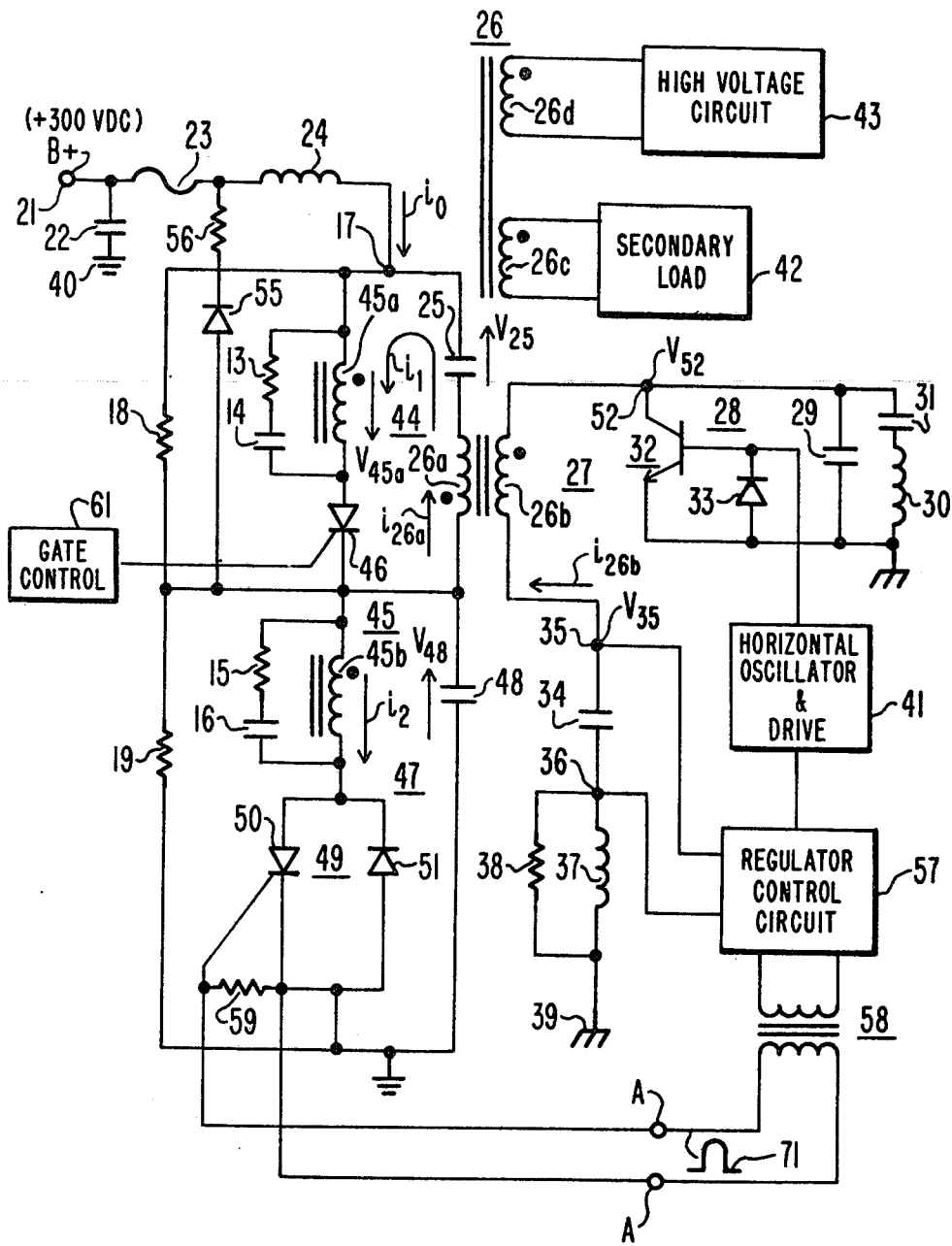
FIG. 1 illustrates a regulated deflection circuit embodying the invention.

As illustrated in FIG. 1, a source of unregulated B+ voltage for a television receiver at a terminal 21, illustratively +300 volts DC, is filtered by a capacitor 22. The +300 volts DC may be obtained by full-wave rectification of a 220 volt AC mains line voltage not shown. The neutral return terminal of the AC mains serves as a nonisolated ground reference terminal 40. Terminal 21 is coupled through a fuse 23 to one terminal of an input choke inductor 24. The other terminal of input choke 24 at a current input terminal 17 is coupled to the series coupled arrangement of a capacitor 25 and a first winding 26a of a first transformer 26.

Transformer 26 functions in part as a horizontal output or flyback transformer for a horizontal deflection circuit 27. Horizontal deflection circuit 27 comprises a trace switch 28, retrace capacitor 29 and series coupled horizontal deflection winding 30 and "S" shaping capacitor 31. Trace switch 28 comprises a horizontal output transistor 32 and a damper diode 33 coupled to the base of transistor 32. Damper diode current flows through the base-collector junction of transistor 32.

The collector of horizontal output transistor 32 is coupled to one end of a second winding 26b of flyback transformer 26. The other end of winding 26b is coupled to a terminal 35 of a storage capacitor 34. Another terminal 36 of capacitor 34 is coupled to an isolated ground reference terminal 39 such as a chassis ground through a parallely coupled arrangement of an inductor 37 and a resistor 38. Isolated ground reference terminal 39 and the previously mentioned neutral nonisolated ground reference terminal 40 are electrically decoupled from each other, thereby providing protection against electrical shock hazards from the AC mains line.

A horizontal oscillator and drive circuit 41 provides horizontal rate drive signals to transistor 32 to establish trace and retrace intervals within each horizontal deflection cycle as illustrated in FIG. 2a by the voltage $V_{52}$ at terminal 52, the collector of horizontal output transistor 32.

A third winding 26c of flyback transformer 26 provides alternating current signals for rectification and power supply for secondary loads 42 such as the vertical deflection circuit and the video circuitry. A high voltage winding 26d of flyback transformer 26 is coupled to a high voltage circuit 43 for generating an ultor accelerating potential.

A controlled amount of energy each horizontal deflection cycle is transferred by winding 26a of flyback transformer 26 to the circuits coupled to windings 26b–26d. Series coupled capacitor 25 and winding 26a form a first resonant circuit 44 with a winding 45a of a second transformer 45. The anode of a first switch, SCR 46, is coupled to winding 45a; the cathode of SCR 46 is coupled to winding 26a.

A second resonant circuit 47 comprises a capacitor 48 and a winding 45b of transformer 45. Windings 45a and 45b are relatively loosely coupled magnetically to each other, with a relatively substantial leakage inductance existing between the windings. A second bidirectional switch 49 comprising an SCR 50 and an oppositely poled diode 51 is coupled between winding 45b and capacitor 48, with the cathode of SCR 50 being coupled to nonisolated ground 40.

As illustrated in FIGS. 2a–2f, during a first portion of the horizontal trace interval after time $T_1$, both SCR 46 and bidirectional switch 49 are nonconductive. An input current $i_0$ transfers stored energy from terminal 21 and input choke 24 to charge capacitor 25 of the first resonant circuit 44 and capacitor 48 of the second resonant circuit 47, as illustrated in FIGS. 2b and 2c prior to time $T_3$ by the voltage $V_{25}$ across capacitor 25 and waveform 54, the voltage $V_{48}$ across capacitor 48. The value of input choke 24 is sufficiently large for the choke to function as a relatively constant source of current $i_0$.

Near time $T_2$, input current $i_0$ has charged capacitor 48 to a voltage $+V_2$ slightly above the B+ voltage of +300 volts DC. A clamp diode 55, coupled to the junction of fuse 23 and input choke 24 through a resistor 56, becomes conductive and clamps the voltage across capacitor 48 to the B+ voltage, thereby limiting the maximum amount of energy stored in capacitor 48. Beginning at $T_2$ the current $i_0$ transfers stored energy of choke 24 to capacitor 25, charging capacitor 25 further positive. The $i_0$ current path now includes the components 24, 25, 26a, 55 and 56.

As illustrated in FIG. 2d, at a controlled instant within the horizontal trace interval, near time $T_3$, SCR 50 of switch 49 is gated into conduction by a pulse position modulated signal 71 coupled to terminals A—A, the gate and cathode terminals of SCR 50. These signals are obtained from a regulator control circuit 57 through a transformer 58. A load resistor 59 is coupled across terminals A—A.

With switch 49 conductive, resonant circuit 47 is formed, and a resonant current $i_2$ flows in winding 45b and capacitor 48 of resonant circuit 47. As illustrated in FIG. 2d, a sinusoidal waveform current $i_2$ flows through winding 45b, completing one cycle of oscillation between times $T_3$–$T_{12}$. The voltage across winding 45b, waveform 62, during the conduction time of switch 49, between times $T_3$–$T_{12}$ of FIG. 2c, equals the voltage $V_{48}$ across capacitor 48, and, neglecting transients, equals zero otherwise, as illustrated by the waveform 60 between times $T_1$–$T_3$.

Near time $T_4$, the voltage across capacitor 48 equals zero and the current $i_2$ is at a maximum, $+I_2$, as illustrated in FIGS. 2c and 2d. The energy stored in capacitor 48 is now stored in the magnetic field of transformer 45. Between times $T_4$–$T_6$, transformer 45 returns energy to capacitor 48, charging the capacitor to the opposite polarity voltage near time $T_6$. Also near time $T_6$ conduction of current in bidirectional switch 49 changes from SCR 50 to diode 51. Between times $T_6$–$T_9$, capacitor 48 discharges energy into winding 45b of transformer 45, and between times $T_9$–$T_{12}$, energy is returned to capacitor 48 to recharge it to its original positive polarity voltage but of a lower magnitude $V_2'$. Near time $T_{12}$ bidirectional switch 49 turns off as current in diode 51 attempts to reverse direction.

A resistor 15 and a capacitor 16 series coupled across winding 45b damp the turn-off transients.

After one complete cycle of oscillation of resonant circuit 47, capacitor 48 has discharged from the voltage $+V_2$ at the beginning of the cycle to the lower voltage $+V_2$ at the end of the cycle. As will now be explained, the discharge energy of capacitor 48 is transferred by means of transformer 45, principally during much of the horizontal retrace interval $T_5$–$T_{11}$, to resonant circuit 44 and then by means of flyback transformer primary winding 26a to the load circuits coupled to the other flyback transformer windings 26b–26d.

Near time $T_5$, the beginning of retrace, a gate control circuit 61 of FIG. 1 couples a turn-on signal to the gate of SCR 46, thereby forming the resonant circuit 44. As illustrated in FIG. 2e, a positive resonant current $i_1$, flows in resonant circuit 44 for one-half cycle of oscillation between times $T_5$–$T_{10}$ also indicated as interval Tr. Capacitor 25 discharges from a positive voltage $+V_1$ to zero near time $T_7$ and recharges to an opposite polarity voltage $-V_1'$ of lesser magnitude between times $T_7$–$T_{10}$. Near time $T_{10}$, SCR 46 is commutated off as the resonant current $i_1$, attempts to reverse direction. A resistor 13 and a capacitor 14 are series coupled across winding 45a to damp the turn-off transients.

Windings 26a and 26b of flyback transformer 26 are relatively tightly coupled to each other. The trace and retrace voltages developed across winding 26a are of similar wave shape to voltage $V_{52}$ of FIG. 2a, neglecting the effects of the relatively small ripple voltage developed across storage capacitor 34. The current $i_{26a}$ through winding 26a during conduction of SCR 46 equals $i_1 - i_0$, that is, the resonant current $i_1$ less the input current $i_0$, as illustrated in FIG. 2e between times $T_5$–$T_{10}$. Energy is transferred from resonant circuit 44 through winding 26a into flyback transformer 26 to the load circuits coupled to the various other windings of transformer 26 that draw power during the retrace interval, such as high voltage circuit 43.

The transferred energy during retrace is obtained principally from two sources. One source is the discharge energy of capacitor 25 during the one-half cycle of $i_1$ current oscillation, when the magnitude of capacitor 25 voltage decreases from $V_1$ to $V_1'$. The second source, as explained previously, is the discharge energy of capacitor 48 during one complete cycle of oscillation.

The resonant current $i_2$ develops a resonant magnetizing voltage across the magnetizing inductance of the electrical equivalent circuit of transformer 45. This resonant magnetizing voltage source transfers energy from capacitor 48 to resonant circuit 44 and to the flyback transformer 26 coupled loads. Power may be transferred to resonant circuit 44 when the current $i_2$ generates a magnetizing voltage component across winding 45a which is positive at the undotted terminal with respect to the dotted terminal. Such a positive magnetizing voltage component is developed across winding 45a during the interval $T_4$–$T_9$, also indicated as the interval Ta, during which time the $di/dt$ of current $i_2$ illustrated in FIG. 2d is negative. This magnetizing voltage component adds to the voltage across capacitor 25 and results in increased current flow in flyback winding 26a.

The DC path for input current $i_0$ is from input terminal 17, through winding 45a, SCR 46, winding 45b, bidirectional switch 49 to ground. Since no DC current can flow through flyback transformer winding 26a, the time averaged current $i_1$ of the resonant circuit 44 flowing between times $T_5$–$T_{10}$ must equal the DC average of input current $i_0$. Similarly, the current $i_2$ flowing through winding 45b must include a DC component equal to the DC average of input current $i_0$. As illustrated in FIG. 2d, the negative peak value $-I_2'$ of current $i_2$ is of lesser magnitude than the magnitude of the positive peak current $+I_2$.

The voltage $V_{45a}$ adds to the voltage across capacitor 25 and results in an increase of current $i_{26a}$. The actual energy transfer to resonant circuit 44 from resonant circuit 47 occurs within an overlapping interval, Tx, when both positive resonant current $i_1$ flows in circuit 44 and when the undotted terminal of winding 45a is positive with respect to the dotted terminal. The overlapping interval, Tx, therefore comprises the common portions of intervals Tr and Ta. Alternatively, the interval Tx comprises the conduction angle overlap of switches 46 and 49. That is, the overlapping interval, Tx, within which energy is transferred to resonant circuit 44 from capacitor 48 and resonant circuit 47, equals the interval $T_5-T_9$ within the horizontal retrace interval.

The relatively substantial leakage inductance between windings 45a and 45b prevents too much energy from being transferred from resonant circuit 47 and enables diode 51 of bidirectional switch 49 to be commutated off. Because of this substantial leakage inductance, the voltages across windings 45a and 45b are not of identical waveshape. As illustrated in FIG. 2f, the voltage $V_{45a}$ across winding 45a, includes after time $t_5$, a negative component when flyback transformer winding 26a and capacitor 25 are coupled across winding 45a.

A greater amount of energy is transferred into the flyback transformer 26 load windings during retrace if a larger resonant circuit 44 current $i_1$ flows during retrace. Since the increased resonant current $i_1$ acts as an increased load on the resonant circuit 47, a longer overlapping interval Tx is required to provide for increased discharge of capacitor 48. If the beginning of the one-half cycle of oscillation of current $i_1$ is fixed to the beginning of retrace near time $T_5$, an increased overlapping interval will be provided by retarding within the trace interval the pulse position modulated signal 71 coupled to SCR 50 of switch 49.

FIG. 3a–3e compare various waveforms for the circuit of FIG. 1 for light loading conditions—the solid waveforms—and for heavy loading conditions—the dashed waveforms—as illustrated in FIG. 3b. The full cycle of oscillation of resonant circuit 47 current $i_2'$ is initiated at a later retarded instant. As illustrated by inspection of FIGS. 3c and 3d, the overlapping interval $T_x'$ from times $T_5—T_9'$ is lengthened. A greater resonant current $i_1'$ and thus current $i_{26a}$ through flyback transformer winding 26a is produced, as illustrated in FIG. 3c. A greater amount of energy is transferred to the other flyback transformer winding loads such as required when video beam loading of the ultor terminal of high voltage circuit 43 increases.

Capacitor 48 at the end of its one cycle of oscillation is discharged more for heavy loading, as illustrated in FIG. 3d at the time $T_{12}'$. As illustrated in FIG. 3e, capacitor 25 of resonant circuit 44 under heavy loading increases its peak to peak variation during the one-half cycle of oscillation. Because the discharge energy of capacitor 48 adds to that of capacitor 25, an increased resonant current $i_1'$ flows with increased overlapping interval, Tx, thereby charging capacitor 25 more negatively at the end of the one-half cycle oscillation of resonant circuit 44. The time integration of input current $i_0$ equals approximately the discharge of capacitor 25 plus the transformed discharge of capacitor 48.

The AC voltages across capacitors 25 and 48 change with flyback transformer loading. At high load the AC voltage across capacitor 25 is high and across capacitor 48 low. At low load the AC voltage across capacitor 48 is high and across capacitor 25 low. Thus, with a fixed B+ voltage at terminal 21, load variation derived changes in the discharge ratio of capacitors 25 and 48 result in the flyback transformer winding 26a being coupled in effect to a capacitive variable voltage divider.

The maximum amount of energy transferred is limited to the energy stored in capacitors 25 and 48. Furthermore, by clamping the maximum voltage across capacitor 48 to the B+ voltage by means of diode 55, the resonant current $i_2$ maximum magnitude is limited, reducing dissipation losses in resonant circuit 47.

Similarly for low AC line mains conditions, retardation of the initiation of oscillation of resonant circuit 47 produces a greater overlapping interval, $T_x'$, as required. To transfer the same amount of energy at a lower B+ voltage the amplitude of $i_1$ remains relatively unchanged but a greater discharge of capacitor 48 is required to compensate for the lower charge of capacitor 25 at time $T_5$.

For high AC line conditions or light loading, a shorter overlapping interval $T_x''$ is required. FIGS. 4a–4e compare various waveforms of the circuit of FIG. 1 for nominal AC line conditions—the solid waveforms—and for high AC line conditions—the dashed waveforms. As illustrated in FIG. 4b, the full cycle of oscillation of resonant circuit 47 current $i_2''$ is initiated at an earlier instant $T_4''$. As illustrated by inspection of FIGS. 4c and 4d, the overlapping interval $T_x''$ from times $T_5-T_9$ is shortened. A slightly lesser resonant current $i_1''$ and thus current $i_{26a}$ is produced as illustrated in FIG. 4c. Because of the increased B+ voltage, however, the same amount of energy is transferred to the flyback transformer loads. As illustrated in FIGS. 4d and 4e, the voltage across capacitor 48 at the end of a complete cycle of oscillation is greater for high AC line than nominal AC line conditions, as is also the average voltage across capacitor 25. FIG. 4c shows also that the shortened overlap period $T_x''$ shortens the conduction time of SCR 46 because the induced voltage across winding 45a changes polarity at the end of $T_x''$ and speeds up the turn-off of SCR 46.

The amount of energy transferred by flyback transformer 26 is a function of the amount of overlap of the interval, Ta, the interval during which the voltage at the undotted terminal of winding 45a is positive relative to the dotted terminal, with the interval, Tr, the interval during which resonant current $i_1$ flows in resonant circuit 44. With gate control circuit 61 turning on SCR 46 at a fixed instant within the deflection cycle, at the beginning of retrace, regulation is achieved by varying the turn-on of bidirectional switch 49 within each deflection cycle, thereby, accordingly varying the overlapping interval Tx.

Alternatively, varying the interval Tx to achieve regulation may be accomplished by varying the occurrence within retrace of the interval Tr during which resonant current $i_1$ flows while maintaining the turn-on of switch 49 at a fixed instant within the trace interval. Regulator control circuit 57 would then supply a pulse position modulated signal within the retrace interval to the gate of SCR 46. Gate control circuit 61 would then supply a fixed time position gating signal to the gate of SCR 50, turning on bidirectional switch 49 at a fixed instant within trace. In this manner also, a variable overlapping interval within retrace may be obtained.

From the entirety of the forgoing description, one notes that energy is transferred during trace by charging and during retrace by discharging capacitors 25 and 48. Energy is transferred directly through flyback transformer 26 to each of the load circuits coupled to flyback transformer windings 26b–26d. Thus, deflection coupled flyback transformer winding 26b does not have flowing through it any current corresponding to the load currents flowing through the other load windings 26c and 26d. In particular ultor beam current variations produce substantially no change in the average current flowing through winding 26b illustrated in FIG. 10b. An AC ringing component, not illustrated, may be present depending upon the type of high voltage circuit used.

As illustrated in FIG. 10b, the current $i_{26b}$ flowing in winding 26b during the trace interval, between times $t_a$–$t_b$ when terminal 52 of FIG. 1 is grounded by trace switch 28, equals a relatively small winding magnetizing current of peak to peak magnitude of 700 milliamperes illustratively. The current $i_{26b}$ reverses direction during the retrace interval, between times $t_b$–$t_c$, with deflection circuit resistive losses being compensated by a general current increase during a first portion of retrace.

As illustrated in FIG. 10c, the current $i_{28}$ through trace switch 28 during its conduction from about times $t_a$–$t_b$ equals the sum of the magnetizing current $i_{26b}$ and deflection winding 30 current. The current $i_{28}$ is thus relatively independent of video load and AC line variations.

By proper component value selection, varying AC line and load conditions will have little effect on retrace pulse amplitude or duration. To prevent significant retrace pulse modulation, the resonant frequencies of resonant circuits 44 and 47 during retrace should approximately equal the retrace frequency established by the resonant circuit of retrace capacitor 29 and horizontal deflection winding 30.

The resonant frequency of capacitor 25 and winding 45a of resonant circuit 44 is selected to approximately equal the retrace frequency. The resonant frequency of capacitor 48 and winding 45b is selected to be slightly less than the retrace frequency. With resonant current $i_2$ flowing in resonant circuit 47 prior to retrace, the increased loading of resonant circuit 47 by resonant circuit 44 during retrace lowers the Q of resonant circuit 47 an amount depending on the leakage inductance existing, thereby increasing the resonant frequency of resonant circuit 47 during retrace to that of the retrace frequency.

During the trace interval, with only input current $-i_0$ flowing in winding 26a, energy is transferred by way of winding 26a to any load circuit that draws power during the trace interval, such as any trace rectified power supply coupled to winding 26c. Because both positive and negative current flows through winding 26b and capacitor 34 during trace, capacitor 34 functions as an energy storage or flywheel element to balance the power flow requirements during trace of any inductive secondary loads 42 coupled to flyback transformer winding 26c.

Figure 5:
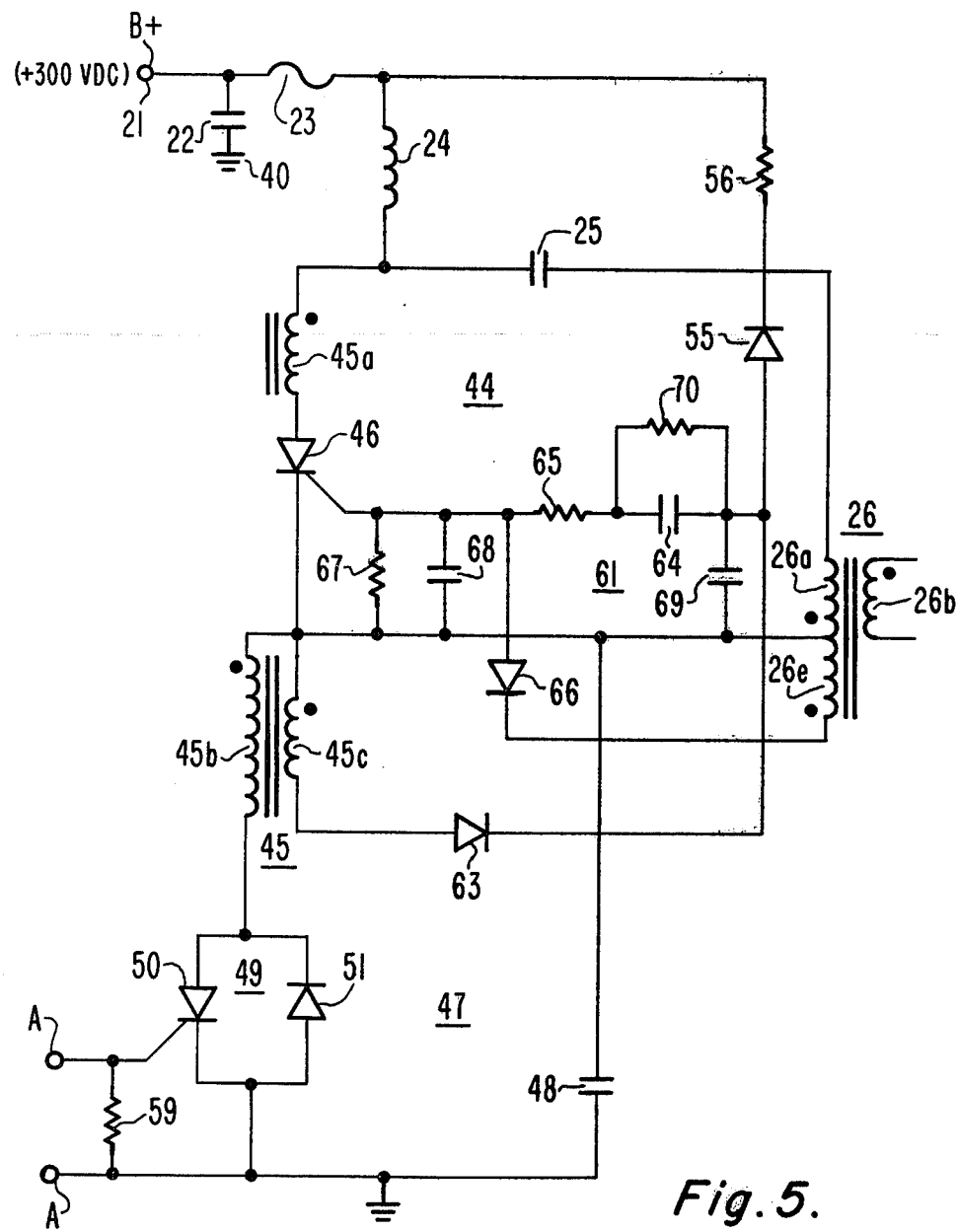
FIG. 5 illustrates an embodiment of the gate control circuit of FIG. 1.

FIG. 5 illustrates an embodiment of SCR 46 gate control circuit 61 which will provide a fixed position turn-on gating signal to SCR 46 substantially coincident with the initiation of the retrace interval. One terminal of a winding 45c of transformer 45 is coupled to the cathode of SCR 46. The other terminal of winding 45c is coupled to the gate of SCR 46 through a diode 63, capacitor 64 and a current limiting resistor 65. A load resistor 67 is coupled across the gate and cathode terminals of SCR 46. Winding 45c is relatively tightly coupled to winding 45b. The voltage developed across winding 45c thus of similar waveshape to waveforms 60 and 62 illustrated in FIG. 2c. The voltage across winding 45c coupled to the gate-cathode path of SCR 46 is positive from times $T_4$–$T_9$. SCR 46, however, is not gated into conduction at time $T_4$ because the SCR gate is maintained negative with respect to the cathode by means of a horizontal trace voltage coupled to the gate from a winding 26e of flyback transformer 26 through a diode 66.

Near the beginning of retrace at time $T_5$, the dotted terminal of winding 26e becomes positive thereby reverse biasing diode 66. The positive voltage of winding 45c at the anode of diode 63 is now AC coupled through capacitor 64 to the gate of SCR 46. SCR 46 is gated into conduction initiating the previously described one-half cycle resonant energy transfer of resonant circuit 44.

A capacitor 68 is coupled across the gate and cathode terminals of SCR 46 to provide a transient bypass path. A similar transient bypass path is provided by capacitor 69 coupled from the cathode of diode 63 to the cathode of SCR 46.

The cathode of diode 63 is coupled to the anode of clamp diode 55. As previously described, near time $T_2$ of FIG. 2c, capacitor 48 is charged by input current $i_0$ to a voltage slightly greater than the B+ voltage of terminal 21. Diodes 63 and 55 become forward biased providing a clamp on the voltage across capacitor 48. With diodes, 63 and 55 conductive, capacitor 64 now discharges the SCR 46 gate current charge it had accumulated during the previous retrace interval. A relatively high valued resistor 70 is coupled across capacitor 64 and discharges any charge on capacitor 64 that remains after the AC line mains supply is decoupled from terminal 21.

Because the voltage across winding 45c providing the turn-on gate signal power to SCR 46, SCR 46 also functions as a circuit breaker in case of a malfunction in the operation of bidirectional switch 49. Should switch 49 become short circuited, for example, no SCR 46 gating signals are developed across winding 45c. SCR 46 therefore will not become conductive, thereby open circuiting the DC current path for input current $i_0$ and providing input short-circuit protection.

Figure 6:
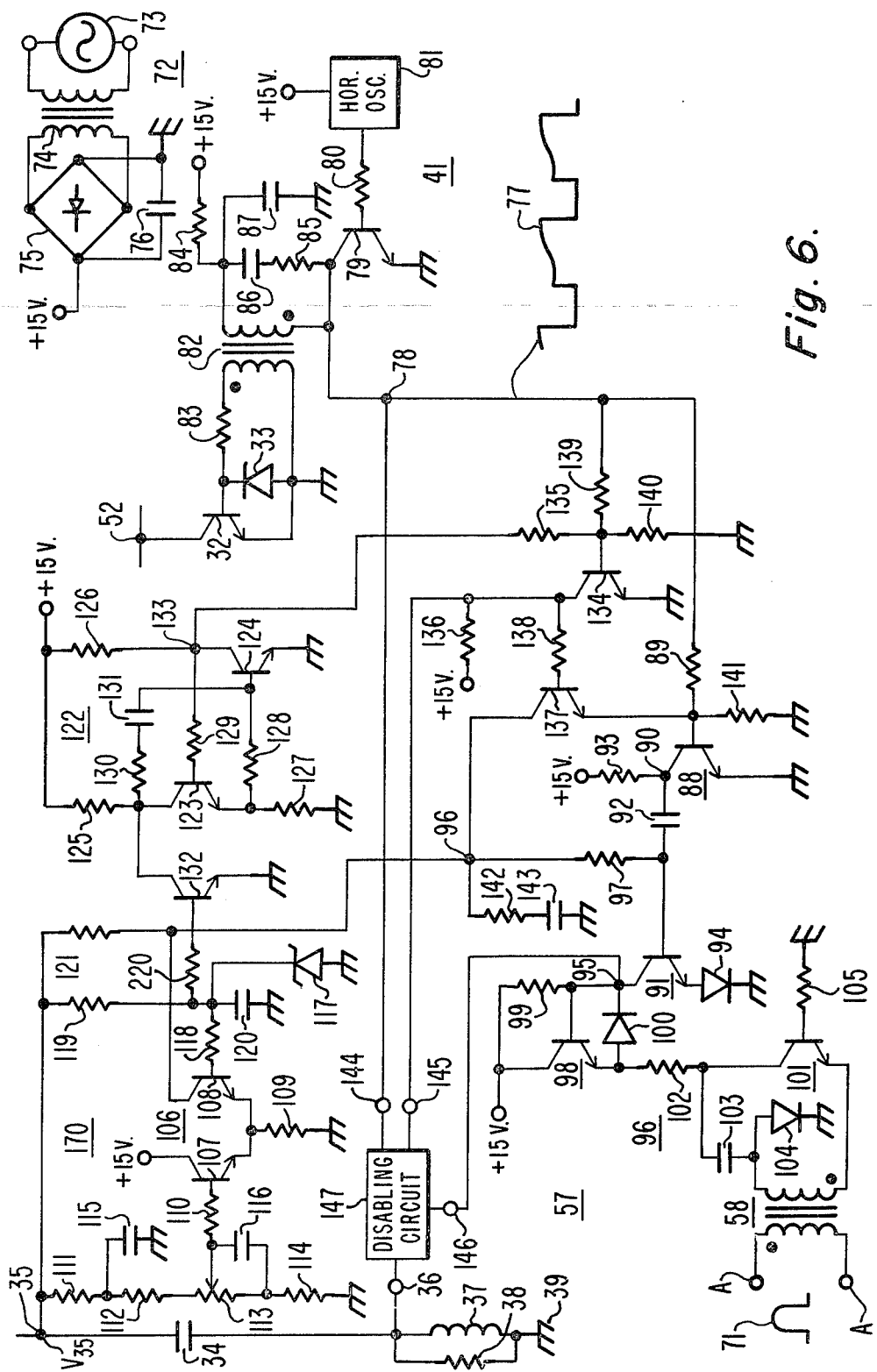
FIG. 6 illustrates an embodiment of the regulator control circuit of FIG. 1.

With the gating signal to SCR 46 fixed in time to coincide with the beginning of retrace, regulation is achieved by varying within each trace interval the pulse position modulated signal 71 obtained from regulator control circuit 57. FIG. 6 illustrates one embodiment of regulator control circuit 57. An energizing voltage of illustratively +15 volts DC is provided by a power supply 72. An AC line mains voltage source 73 is coupled through transformer 74 to a full-wave bridge rectifier 75 and filtered by a capacitor 76 to provide the filtered +15 volt DC supply.

To synchronize operation of regulator control circuit 57 with horizontal deflection, horizontal drive signals 77 from horizontal oscillator and driver 41, illustrated in FIG. 7b, are coupled to a terminal 78, the collector of a horizontal driver transistor 79. Horizontal driver transistor 79 is switched at a synchronized horizontal rate by signals coupled to its base through a resistor 80 from a synchronized horizontal oscillator 81. Drive signals 77 are coupled by transformer 82 to the base of horizontal output transistor 32 through a resistor 83 to generate the horizontal trace and retrace signals illustrated in FIG. 7a. Collector voltage for transistor 79 is obtained from the +15 volt supply through a resistor 84 and the primary winding of transformer 82. A transient damping series coupled resistor 85 and a capacitor 86 are coupled across the primary winding of transformer 82. A capacitor 87 is coupled to resistor 84.

Horizontal drive signals 77 are coupled to the base of a transistor 88 through a resistor 89. Inverted drive signals 90 are developed at a terminal 90, a collector of transistor 88, as illustrated in FIG. 7c. Transistor 88 and a transistor 91 are coupled together to form a boxcar integrator, with the collector of transistor 88 coupled to the base of transistor 91 through a capacitor 92. The junction of capacitor 92 and the collector of transistor 88 is coupled to the +15 volt supply through a resistor 93. The emitter of transistor 91 is coupled to ground through a diode 94.

Pulse width modulated signals 95, as illustrated in FIG. 7d, are developed at a terminal 95, at the collector of transistor 91, and are coupled to a regulator driver stage 96 to produce the pulse position modulated signals 71 at terminals A—A.

At time $t_0$ of FIG. 7b, horizontal drive signal 77 goes high, turning on transistor 88 into saturation. Capacitor 92 which is charged to about 15 volts by the +15 volt supply begins to discharge, with current flowing from a terminal 96 through a resistor 97. The discharge current is developed by a variable current source 170, the magnitude of which current is established by sensing an energy level within horizontal deflection circuit 27.

The collector of transistor 91 is coupled to the base of a transistor 98 of regulator driver stage 96 and is coupled to the +15 volt supply through a resistor 99. The emitter of transistor 98 is coupled to the collector of transistor 91 through a diode 100 and is coupled to the collector of a transistor 101 through a resistor 102. The collector of transistor 101 is coupled to ground through a capacitor 103 and a diode 104. The base of transistor 101 is coupled to ground through a resistor 105. The emitter of transistor 101 is coupled to the dotted terminal of the primary winding of transformer 58. The undotted terminal of transformer 58 is coupled to the junction of capacitor 103 and diode 104.

With transistor 88 conducting, beginning at time $t_0$, the current from terminal 96 is shunted away from the base of transistor 91, thereby turning off transistor 91. Transistor 98 turns on, charging capacitor 103 from the +15 volt supply.

After an elapsed interval determined by the magnitude of the current flowing from terminal 96, capacitor 92 has been sufficiently charged to the opposite polarity to enable transistor 91 to turn on. Transistor 98 cuts off. With transistor 98 off and transistor 91 conducting, the negative bias on the emitter of transistor 101 obtained from the charge on capacitor 103 turns on transistor 101. Base current for transistor 101 flows from capacitor 103 through resistor 102, diode 100, transistor 91, diode 94 and resistor 105.

With transistor 101 conducting, capacitor 103 discharges through the primary winding of transformer 58. A pulse position modulated signal 71 is produced at time $t_2$, as illustrated in FIG. 7e. Pulse 71, when coupled to bidirectional switch 49, initiates the resonant oscillation of resonant circuit 47 and the energy transfer to resonant circuit 44 and to the load circuits coupled to flyback transformer 26.

Transistor 91 remains conductive between times $t_2$ through $t_4$. Between times $t_2$—$t_3$ current from terminal 96 provides sufficient base current to transistor 91 to maintain transistor 91 in saturation. Between times $t_3$—$t_4$, drive signals 77 are in the lower voltage state and turn off transistor 88. Capacitor 92 charges to 15 volts through resistor 93, base emitter of 91 and diode 94. During this interval, current from the terminal 96 and the charge current of capacitor 92 maintain transistor 91 in saturation. At time $t_3'$, capacitor 92 has completed its charge, as illustrated by the rounded slope of waveform 90. Near time $t_4$, a new discharge cycle begins again.

The exact time position of pulse 71 is determined by the discharge rate of capacitor 92 as established by the magnitude of variable current source 170. The energy level sensed within horizontal deflection circuit 27 is the DC voltage $V_{35}$ developed across capacitor 34 at terminal 35, as illustrated in FIG. 7f. The voltage at terminal 35 represents the integrated or DC value of the retrace pulse voltage developed at the collector of horizontal output transistor 32. The voltage $V_{35}$ is a sensitive measure of the retrace pulse amplitude and responds quickly to variations in high voltage and deflection amplitudes.

A divided down voltage proportional to $V_{35}$ is coupled through a resistor 110 to the base of a transistor 107, the base being an input terminal of a differential comparator 106 comprising transistors 107 and 108 and an emitter resistor 109. The divided down voltage is obtained at the wiper arm of a resistor 113 of voltage dividing resistors 111–114 coupled to terminal 35. A capacitor 115 is coupled to the junction of resistors 111 and 112 for filtering the horizontal ripple component of voltage $V_{35}$. A capacitor 116 is coupled from the wiper arm of resistor 113 to the junction of resistors 113 and 114 and bypasses from comparator 106 any wiper arm movement contact noise.

A reference voltage developed across a zener diode 117 is coupled to a second input terminal of comparator 106 at the base of transistor 108 through a resistor 118. Biasing voltage for zener 117 is obtained from terminal 35 through a resistor 119. A capacitor 120 is coupled across zener 117.

The output of variable current source 170 is obtained at the collector of transistor 108 which is coupled to terminal 96. The voltage $V_{35}$ at terminal 35 serves as the voltage source for supplying source current to terminal 96 through a resistor 121.

Transistor 108 functions as a variable shunt impedance to shunt to ground a controlled amount of source current from resistor 121, thereby varying the magnitude of the discharging current flowing from terminal 96 to capacitor 92.

Should the voltage $V_{35}$ decrease, due either to increased loading by flyback transformer 26 load circuits or due to decreased B+ voltage at terminal 21, a greater overlapping interval $T_x$ in which current in both resonant circuits 44 and 47 flows is required, as previously described. The impedance of shunt transistor 108 decreases with a decrease in $V_{35}$ voltage. Less discharging current flows to capacitor 92, delaying the turn-on of transistor 91 until time $t_3$, as illustrated in FIG. 7d by the dashed negative going edge 95a of pulse width modulated signal 95. As illustrated in FIG. 7e, a retarded pulse positioned modulated gating signal 71a is produced at time $t_3$, thereby providing for an increased overlapping interval $T_x$ as required.

For decreased flyback transformer 26 loading or increased B+ voltage, the shunt impedance of transistor 108 increases, providing for an increased discharging current to capacitor 92. Turn-on of transistor 91 is advanced to time $t_1$, as illustrated in FIG. 7d by dashed negative going edge 95b. An advanced pulse position modulated gating signal 71b is produced at time $t_1$, as illustrated in FIG. 7e, thereby providing for a decreased overlapping interval $T_x$.

The most advanced time $t_1$ of the regulation control range $t_1$–$t_3$ is established by the maximum shunt impedance of transistor 108, that is, when transistor 108 is cut off. The most retarded time $t_3$ is established when transistor 107 is cut off. At time $t_3$, the negative going edge of drive signal 77 turns off transistor 88 and turns on transistor 91 thereby generating pulse 71a.

A start-up interval exists immediately after operative power from rectified AC mains supply is coupled to terminal 21, at the beginning of which interval capacitors 25, 34, 48 and filter capacitors of flyback transformer 26 load circuits are uncharged. To prevent large initial in-rush currents from flowing and large overshoot voltages from being developed, regulator control circuit 57 provides for a gradual or reduced transfer of energy through flyback transformer 26 during this start-up interval, as will now be explained.

As astable multivibrator 122 comprises transistors 123 and 124, resistors 125–129 and a series coupled integrating network comprising a resistor 130 and a capacitor 131 coupled between the collector of transistor 123 and the base of transistor 124. The bilevel output voltage of multivibrator 122, developed at an output terminal 133 at the collector of transistor 124, is coupled to the base of a transistor 134 through a resistor 135. The base of transistor 134 is coupled to terminal 78 through a resistor 139 and is coupled to ground through a resistor 140. The collector of transistor 134 is coupled to the +15 volt supply through a resistor 136 and is coupled to the base of a transistor 137 through a resistor 138. The collector of transistor 137 is coupled to terminal 96 and the emitter of transistor 137 is coupled to the base of transistor 88. A resistor 141 couples the base of transistor 88 to ground.

When operative AC line mains supply is coupled to terminal 21 and to the +15 volt terminal at the output of full-wave rectifier 75, the output terminal 133 of astable multivibrator 122 is at a low state with transistor 124 in saturated conduction. Horizontal drive signals 77 are developed and switching signals are coupled to the base of horizontal output transistor 32.

With transistor 124 conducting, little current flows through resistor 135. Transistor 134 acts as inverter for signal 77 and feeds the inverted signal through the base emitter of transistor 137 to the base of transistor 88. Thus at the base of transistor 88 inverted and noninverted signals 77 are added resulting in transistor 88 always remaining in saturation. Consequently transistor 91 remains in cut-off and no pulses 71 are generated.

The voltage at output terminal 133 of astable multivibrator 122 will switch to its upper level voltage when transistor 124 becomes nonconductive. Transistor 124 will become nonconductive after the elapse of predetermined inhibit interval established by the RC time constant associated with capacitor 131. For the circuit element values listed below, this inhibit interval equals approximately one second.

During the one second inhibit interval within the start-up interval, capacitor 25 of resonant circuit 44 and capacitor 48 of resonant circuit 47 charge from the B+ terminal 21 voltage to the voltages established across respective voltage dividing resistors 18 and 19 coupled between current input terminal 17 and isolated ground 40, as illustrated in FIG. 1.

After the elapse of the inhibit interval, the voltage at terminal 133 goes high, driving into saturation transistor 134 and thus cutting off transistors 137. Transistor 88 now receives at its base only signal 77 and starts operation by providing transistors 91 with signal 90. Transistor 91 turns on, receiving base current AC-wise through capacitor 92. Since at this time the voltage at terminal 35 is still zero, no discharge current flows through resistor 97. Consequently the very first pulses 71 are positioned at time $t_3$, as illustrated by 71a of FIG. 7e.

With no voltage developed across flyback transformer winding 26e of FIG. 5, gate control circuit 61, gates SCR 46 into conduction immediately when the dotted terminal of winding 45c of transformer 45 becomes negative. Resonant circuit 44 current $i_1$ flows in flyback transformer winding 26a for a relatively long one-half cycle of oscillation because of the heavy flyback loading during turn-on. Energy is transferred from capacitors 25 and 48 to capacitor 34 of horizontal deflection circuit 27. The fact that the very first pulses 71 are positioned at $t_3$ causes maximum energy transfer through transformer 26 and consequently rapid increase of voltage $V_{35}$.

At the beginning of the start-up interval the base voltages of transistors 107 and 108 are zero. Thus no shunt current can flow through transistor 108. As the voltage $V_{35}$ rapidly increases, the current through resistors 121 and 97 increases at a similar rate, resulting in the occurence of pulses 71 being shifted to time $t_1$. The reduced power transfer during inrush is determined in part by the values of resistors 121, 97 and capacitor 92.

The voltage coupled to the base of transistor 108 is developed relatively slowly, because capacitor 120 is relatively large and thus a relatively slow RC time constant is associated with capacitor 120. Transistor 108 therefore remains cut off as capacitor 120 relatively slowly charges to the zener voltage of zener diode 117, the zener voltage for example being 6.2 volts. The current flowing in resistor 121 is not shunted by transistor 108 and all of the current goes to discharge capacitor 92. An RC damping network for damping initial inrush current and comprising a resistor 142 and a capacitor 143 is coupled to terminal 96.

With transistor 108 cut off, the occurrence of the negative going edge of pulse width modulated signal 95 is advanced to its extreme position, to time $t_1$. The occurrence of pulse position modulated signal 71 is also advanced to its extreme position $t_1$, thereby providing a reduced overlapping interval Tx and the gradual transfer of energy during the start-up interval.

This advanced position is maintained until the voltage at the bases of both transistor 107 and 108 are equal, at which time transistor 108 begins conducting thereby causing the retardation of pulse 71 and the increased transfer of energy to deflection circuit 27. The voltage $V_{35}$ begins to slowly increase to its steady state value of approximately 120 volts, for example, at a rate corresponding to the slowly increasing voltage across capacitor 120. The voltage $V_{35}$ reaches its steady state value approximately one second after the initial 60 percent charge across capacitor 34 is first developed.

To prevent astable multivibrator 122 from interfering with normal operation of transistors 88 and 91, output terminal 133 is maintained at its upper level voltage during steady state operation by transistor 132 which shortcircuits to ground the collector of transistor 123. The base of transistor 132 is coupled by a resistor 220 to capacitor 120. When capacitor 120 is charged to approximately one volt during the latter portion of the start-up innterval, transistor 132 conducts in a saturated state and provides the short-circuit path at the collector of transistor 123.

If during the start-up interval a sufficient voltage is not developed across capacitor 120 to turn on transistor 132, astable multivibrator will switch the output voltage at terminal 133 to its lower voltage level for another one second inhibit interval. Transistor 88 is maintained in saturation for this interval and prevents the development of pulses 71 and the triggering of bidirectional switch 49. Capacitor 25 and 48 can again be charged during this inhibit interval and energy may again be transferred when the voltage at astable multivibrator output terminal 133 switches to its upper level voltage.

To provide for disabling of normal operation of regulator control circuit 57 of FIG. 6 under fault conditions, a disabling circuit 147 senses a fault condition in signals coupled to a fault input terminal 36. These signals monitor for example the current flowing in winding 26b and capacitor 34. A disabling output signal is then coupled from a terminal 146 and grounds the collector of transistor 91 thereby preventing the recharging of capacitor 103 and the subsequent development of pulses 71 for the triggering of bidirectional switch 49. The voltage across capacitor 34 decreases to zero, and retrace pulses are no longer developed in the flyback transformer 26 windings, effectively disabling deflection circuit 27.

To provide for automatic restart after disabling, capacitor 120 discharges through resistor 220. When capacitor 120 has discharged sufficiently to cut off transistor 132, operation of astable multivibrator 122 is reenabled. The voltage at terminal 133 goes to zero and transistor 134 starts operating again as an inverter for signal 77. Transistor 134 via transistor 137 keeps transistor 88 in saturation and resets the disabling circuit 147 via terminal 145. Further, capacitor 120 discharges completely through resistor 118, the collector-base junction of transistor 108, the collector-emitter path of transistor 137 when transistor 137 is conducting, and the base-emitter junction of transistor 88. Transistor 137 conducts each horizontal deflection cycle during the interval when horizontal drive signals 77 coupled to the base of transistor 134 turn off transistor 134.

After a one second inhibit interval, output terminal 133 switches to its upper state, turning on transistor 134 into saturated conduction. A new restart interval begins. Capacitors 25 and 48 are charged from the current supplied through input terminal 17 to the voltages established by voltage dividing resistors 18 and 19. The discharge of capacitors 25 and 48 through flyback transformer 26 during this restart interval and subsequent circuit operation are similar to that previously described.

An embodiment of disabling circuit 147 is illustrated in FIG. 8. The fault signal sensed is the current $i_{26b}$ flowing through winding 26b, as illustrated in FIG. 10b for normal operating conditions. Current $i_{26b}$ flows mainly through current sensing inductor 37 across which is coupled damping resistor 38.

Inductor 37 functions as a low pass filter. During retrace between times $t_a$–$t_b$ of FIG. 9a, current $i_{26b}$ reverses direction. The predominant frequency component is the relatively high retrace frequency component of approximately 44 KH. A voltage $V_{36}$ is developed across inductor 37 at fault input terminal 36, as illustrated in FIG. 9c.

During the trace interval, between times $t_b$–$t_d$, the predominent frequency component of current $i_{26b}$ is much lower, about 4 KH. The impedance of inductor 37 is thus much lower during trace, and very little voltage is developed at fault input terminal 36 during the trace interval.

Should a malfunction, such as a short circuiting of SCR 46, occur during the next deflection cycle starting at time $t_d$, for example, fault signal voltage $V_{36}'$ will no longer be insignificant during the trace interval, starting at time $t_e$, as illustrated in FIG. 9c. Rather with SCR 46 short circuited, resonant circuit 44 goes into full cycle oscillations during trace with energy being transferred through flyback transformer 26 between capacitor 34 and resonant circuit 44.

The voltage $V_{36}'$ from time $t_d$ comprises a damped ringing voltage at the frequency of resonant circuit 44, which is near the retrace frequency. The ringing voltage is coupled through a filter network comprising a resistor 148 and capacitors 149 and 150 to an input terminal 152 of a disabling latch 153. The voltage $V_{152}$ at terminal 152 is thus a slightly phase shifted voltage similar to the voltage at terminal 36, as illustrated in FIG. 9d after time $t_f$.

Latch 153 comprises complementary transistors 154 and 155 regeneratively coupled together and resistors 156–160. The collector of transistor 154 is coupled to output terminal 146 of disabling circuit 147 through a diode 161.

A diode 151 is coupled across capacitor 150 and removes any negative excursions of ringing voltage $V_{152}$, as illustrated in FIG. 9d from times $t_f$–$t_g$. Under fault conditions, when fault signal voltage $V_{36}'$ is developed at terminal 36, the positive voltage $V_{152}$ at time $t_f$ is coupled to input terminal 152, energizing latch 153. Output terminal 146 is grounded through transistor 154, thereby grounding the collector of transistor 91 of FIG. 6. Regulator driver stage 96 is disabled while latch 153 is energized, preventing gating pulses 71 from turning on bidirectional switch 49. All the supply voltages of flyback transformer 26 load circuits are relatively quickly removed, disabling normal television receiver operation.

Thus, disabling circuit 147, by monitoring the current flowing in the isolated circuit portion winding 26b, is able to detect a fault conditioning in the nonisolated circuit portions coupled to winding 26a.

A first clamp transistor 162 is coupled to the collector of transistor 155 through resistor 158. A resistor 162 couples the base of transistor 162 to ground, and a resistor 164 couples the base to terminal 145. Latch 153 is deenergized when clamp transistor 162 is turned on, thereby shunting base current away from transistor 154. Transistor 162 is turned on and off at horizontal rate after astable multivibrator 122 is reenabled during the previously described restart interval and switches the voltage at output terminal 133 to its lower level voltage. Transistor 134 is cut off, during the time waveform 77 is in its lower level permitting the +15 volt supply to be coupled to terminal 145 to turn on periodically transistor 162.

A second clamp transistor 165 clamps the voltage at terminal 152 to ground during the entirety of every retrace interval. This clamping prevents the erroneous energizing of latch 153 under normal operating conditions when the voltage at terminal 36 becomes positive during the latter portion of retrace.

The collector of a transistor 166 is coupled to the base of transistor 165 and to the +15 volt supply through a resistor 167. The base of transistor 166 is coupled to ground through a resistor 168 and is coupled to a terminal 144 of disabling circuit 147 through a resistor 169.

Horizontal rate drive signals 77 from terminal 78 of FIG. 6 are coupled to terminal 144, inverted by transistor 166 and coupled to the base of transistor 165. As illustrated in FIGS. 9c and 9d, transistor 165 clamps terminal 152 to ground during the interval $t_c$–$t_f$ when drive signals 77 are low, thereby also clamping terminal 152 to ground during the retrace interval $t_d$–$t_e$ as is required. Selected circuit values and component values for a typical embodiment of the circuits previously described are given below:

| Resistor | 13 | 1000Ω | Resistor | 125 | 4.7KΩ |
|---|---|---|---|---|---|
| | 15 | 1000Ω | | 126 | 4.7KΩ |
| | 18 | 2.2MΩ | | 127 | 680Ω |
| | 19 | 1MΩ | | 128 | 100KΩ |
| | 38 | 100Ω | | 129 | 47KΩ |
| | 56 | 33Ω | | 130 | 100KΩ |
| | 59 | 100Ω | | 135 | 10KΩ |
| | 65 | 100Ω | | 136 | 4.7KΩ |
| | 67 | 100Ω | | 138 | 4.7KΩ |
| | 70 | 100KΩ | | 139 | 10KΩ |
| | 89 | 10KΩ | | 140 | 4.7KΩ |
| | 93 | 2.2KΩ | | 141 | 4.7KΩ |
| | 97 | 12KΩ | | 142 | 33KΩ |
| | 99 | 4.7KΩ | | 148 | 1000Ω |
| | 102 | 100Ω | | 156 | 4.7KΩ |
| | 105 | 1000Ω | | 157 | 10KΩ |
| | 109 | 2.2KΩ | | 158 | 2.2KΩ |
| | 110 | 2.2KΩ | | 159 | 2.2KΩ |
| | 111 | 47KΩ | | 160 | 1000Ω |
| | 112 | 47KΩ | | 163 | 4.7KΩ |
| | 113 | 4.7KΩ | | 164 | 10KΩ |
| | 114 | 2.2KΩ | | 167 | 4.7KΩ |
| | 118 | 220Ω | | 168 | 4.7KΩ |
| | 119 | 68KΩ | | 169 | 10KΩ |
| | 121 | 68KΩ | | 171 | 1000Ω |
| | 220 | 6800Ω | | | |

| Capacitor | 14 | 1000pF |
|---|---|---|
| | 16 | 2200pF |
| | 22 | 400μF |
| | 25 | 0.047μF |
| | 29 | 12000pF |
| | 31 | 0.68μF |
| | 34 | 0.47μF |
| | 48 | 0.068μF |
| | 64 | 0.1μF |
| | 68 | 4700pF |
| | 69 | 0.022μF |
| | 92 | 2200pF |
| | 103 | 0.047μF |
| | 115 | 1μF |
| | 116 | 10μF |
| | 120 | 100μF |
| | 131 | 2.2μF |
| | 143 | 1μF |
| | 149 | 0.47μF |
| | 150 | 0.01μF |
| Inductor | 24 | 50mH |
| | 30 | 1.2mH |
| | 37 | 50μH |

TRANSFORMER 45:

Windings 45a and 45b: each 75 turns of 10×0.2 mm litz wire, and each an inductance of 310 μH. Leakage inductance between windings 45a and 45b equals 250 μH. Winding 45c: 12 turns of 0.4 mm copper wire wound over winding 45b. Core: 10×60 mm, N22 ferrite stud.

TRANSFORMER 26:

core: Standard U57 ferrite core with 0.1 mm air gap. Winding 26a: 25 turns of 2×0.4 mm copper wire; winding 26b: 116 turns of 0.3 mm copper wire; winding 26d: 880 turns of 0.12 mm copper wire: winding 26e: 5 turns of 0.4 mm copper wire. Ten volts per turn developed in each winding. Isolation between windings 26a and 26b greater than 4000 volts with a corona creepage distance of 8 mm.

HIGH VOLTAGE CIRCUIT 43:

High voltage tripler providing an ultor voltage of approximately 23 kilovolts and an internal impedance of approximately 0.88 megaohms.

Figure 11:
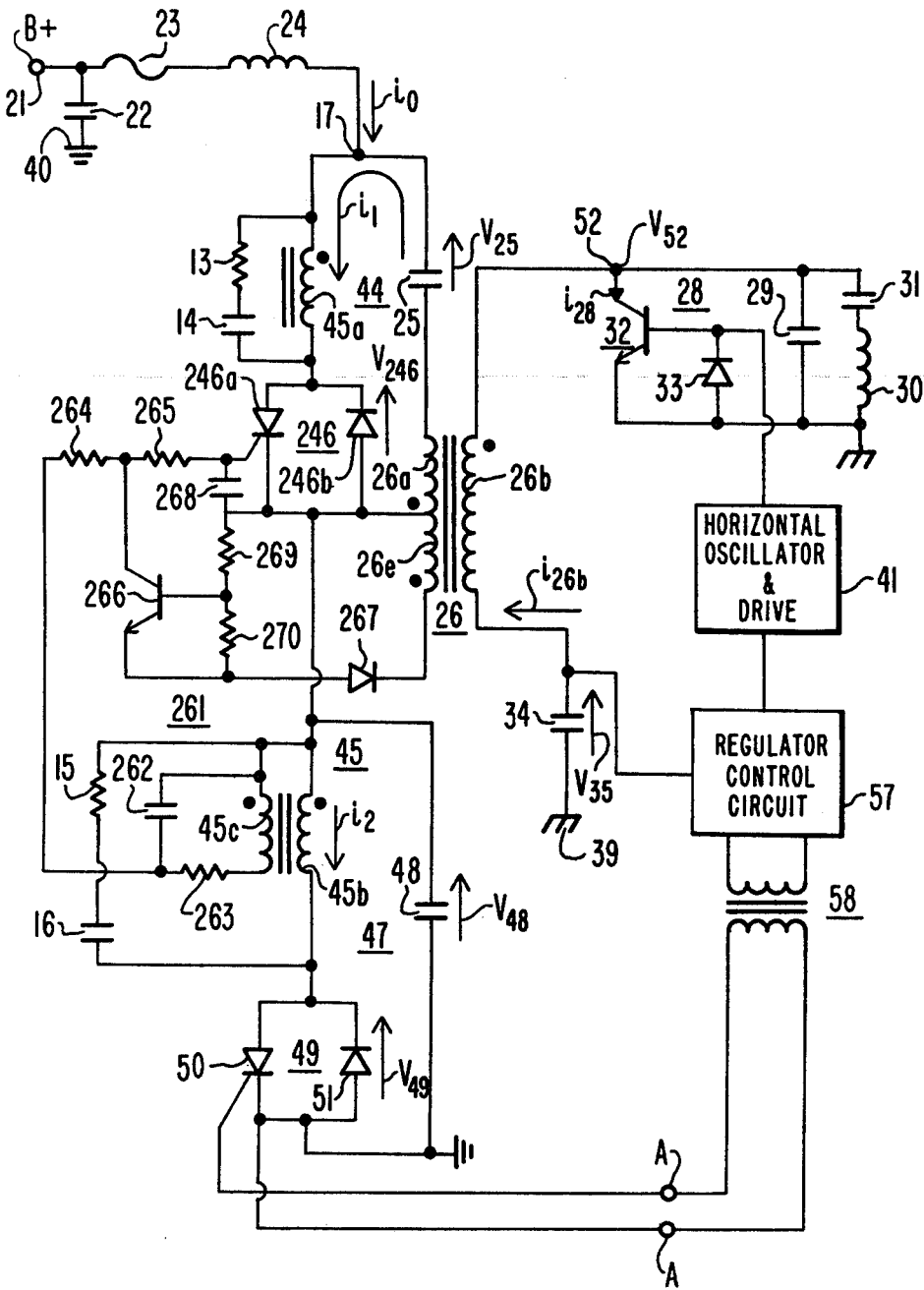
FIG. 11 illustrates another regulated deflection circuit embodying the invention.

FIG. 11 illustrates another regulated horizontal deflection circuit embodying the invention similar in functioning to the circuit of FIG. 1. Identically labelled elements in the two circuits have similar functions. The circuit of FIG. 11 however uses a bidirectional switch 246, rather than an SCR, as the regulator switch for resonant circuit 44. Bidirectional switch 246 comprises an SCR 246a and a parallel oppositely poled diode 246b.

Various waveforms of currents and voltages at designated locations in the circuit of FIG. 11 are illustrated in FIGS. 12 and 13. The solid line waveforms illustrate a light load current condition of about zero milliampere beam current, for example, whereas the dashed line waveforms illustrate a heavy load current condition of about one milliampere beam current.

Figures 12A, 12B, 12C, 12D, 12E:
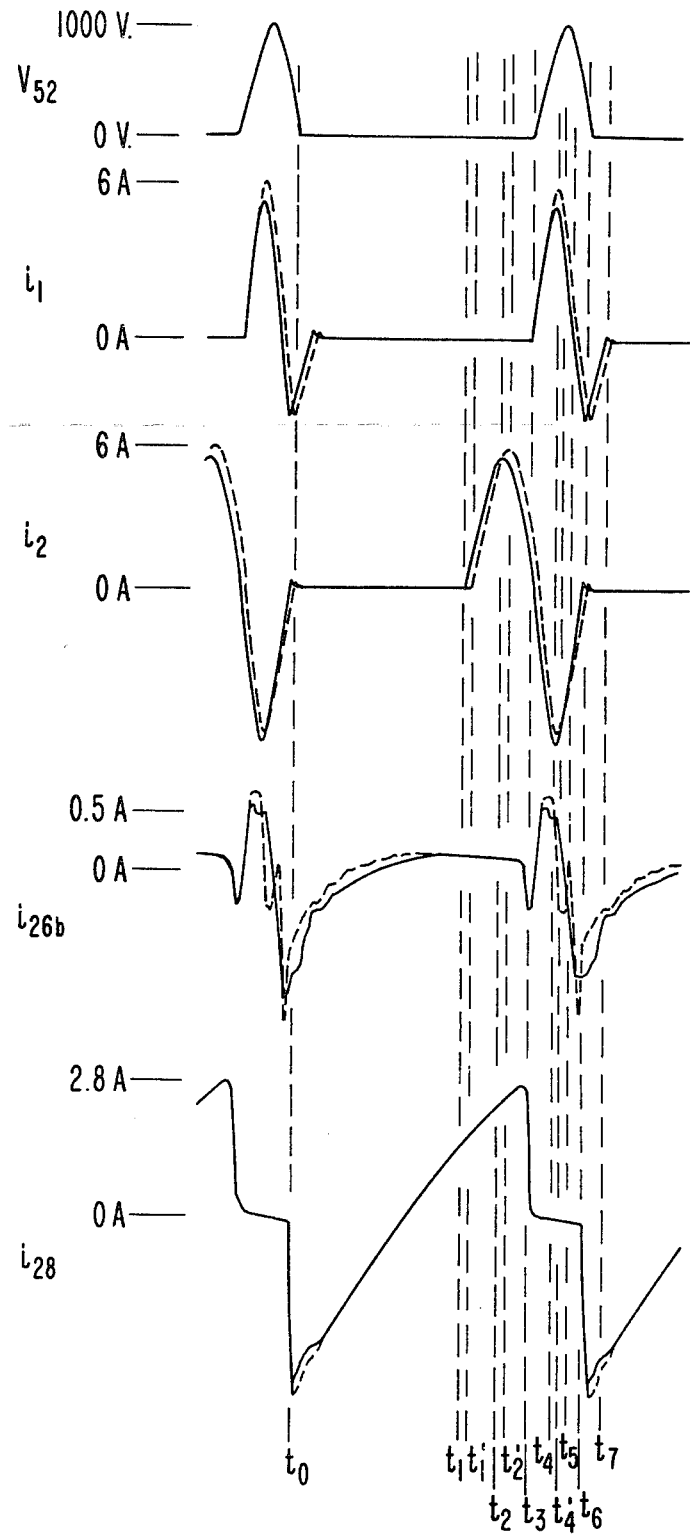

As illustrated in FIG. 12c by the resonant circuit 47 current $i_2$, at a controlled instant $t_1$ within the trace interval $t_0$–$t_3$, bidirectional switch 49 is made conductive. Current $i_2$ goes through one complete cycle of oscillation between times $t_1$–$t_6$. Energy is transferred from resonant circuit 47 through transformer 45 to resonant circuit 44 and flyback transformer 26 coupled load circuits during portions of the interval $T_a$, that is, the interval $t_2$–$t_4$ when the di/dt of current $i_2$ is negative. During this interval, winding 45b functions as a voltage source for the transferral of energy, as described previously for the circuit of FIG. 1.

Energy is transferred from resonant circuit 44 to the retrace driven load circuits coupled to flyback transformer 26 beginning at time $t_3$, the beginning of the retrace interval. At time $t_3$, gate control circuit 261 turns on bidirectional switch 246 and a resonant current $i_1$ flows in resonant circuit 44, as illustrated by FIGS. 12b, and by FIG. 13c, the voltage $V_{246}$ across switch 246. Because switch 246 is bidirectional, both positive and negative current $i_1$ flows, going through one complete cycle of oscillation between times $t_3$–$t_7$. At time $t_7$, switch 246 turns off.

Energy is transferred within retrace to the load circuits of flyback transformer 26 during the interval $T_r$ that is, the interval $t_3$–$t_5$ when positive resonant current $i_1$ flows. After one complete cycle of oscillation of both resonant currents $i_1$, and $i_2$, capacitor 25 has discharged from a voltage $+V_a$ at time $t_3$ to a lesser positive voltage $+V_a'$ at time $t_7$, and capacitor 48 has discharged from a voltage $+V_b$ at time $t_1$ to a lesser positive voltage $+V_b'$ at time $t_6$.

To achieve regulation, the conduction angle overlap or the overlapping interval $T_x$ or $t_3$–$t_4$, common to both intervals $T_a$ and $T_r$, is varied by for example varying the turn-on instant of bidirectional switch 49. As illustrated by the dashed line waveforms of FIGS. 12c and 13e, for heavy beam loading, the turn-on instant is retarded to time $t_1'$, thereby increasing the overlapping interval to $T_x'$, or $t_3$–$t_4'$ as required for increased energy transfer to the high voltage circuit, not illustrated in FIG. 11.

Despite the increased energy transfer, the currents flowing in flyback secondary winding 26b and trace switch 28 change relatively little from light to heavy beam loading, as illustrated in FIG. 12d by the current $i_{26b}$ flowing in flyback secondary winding 26b and in FIG. 12e by the current $i_{28}$ flowing in trace switch 28.

The regulated horizontal deflection circuit of FIG. 11 does not include the clamp diode 55 and resistor 56 of FIG. 1, thereby eliminating dissipative losses that would occur during conduction of diode 55. As illustrated in FIGS. 13d and 13e, capacitor 48 of FIG. 11 charges from the input current $i_O$ for the entirety of the interval that switch 49 is nonconductive. Without diode 55, the maximum amount of flyback transferrable energy is further limited, because current is no longer supplied to capacitor 25 to further charge capacitor 25 when the voltage across capacitor 48 exceeds the B+ voltage. Thus no protection circuitry is required within regulator control circuit 57, and the inductor 37 and resistor 38 of FIG. 1 are omitted from the circuit of FIG. 11. Should the load coupled flyback windings become short-circuited, energy transfer will cease because capacitors 25 and 48 cannot discharge.

The gate control circuit 261, illustrated in FIG. 11, for turning on SCR 246a of switch 246 at the beginning of retrace includes a flyback winding 26e and a winding 45c of transformer 45 magnetically coupled to winding 45b. A positive voltage is developed at the undotted terminal of winding 45c between times $t_2$–$t_4$. This voltage is slightly smoothed by a capacitor 262 and resistor 263 and coupled to the gate of SCR 246a through resistors 264 and 265. A capacitor 268 is coupled between the gate of SCR 246a and winding 26e to provide a transient bypass path. SCR 246a is not gated into conduction during trace because the positive voltage of winding 45c is bypassed from the gate of SCR 246a by conduction of a transistor 266, the current path being winding 45c, resistor 263, resistor 264, transistor 266, a diode 267, winding 26e, back to winding 45c.

Transistor 266 conducts during trace, because it is forward biased by the trace voltage developed by winding 26e and coupled to the base of transistor 266 by a resistor 269 of voltage dividing resistors 269 and 270. At the beginning of retrace, transistor 266 is cut off, enabling the positive voltage across winding 45c to gate SCR 246a into conduction at time $t_3$.

Selected circuit and component values for the circuit of FIG. 11 are given below.

| | | |
|---|---|---|
| Resistor | 13: | 1000 ohm |
| | 15: | 1000 ohm |
| | 263: | 47 ohm |
| | 264: | 100 ohm |
| | 265: | 10 ohm |
| | 269: | 470 ohm |
| | 270: | 1000 ohm |
| Capacitor | 14: | 1000 ohm |
| | 15: | 2200 ohm |
| | 22: | 330 microfarad |
| | 25: | 0.1 microfarad |
| | 29: | 12000 picofarad |
| | 31: | 0.68 microfarad |
| | 35: | 0.47 microfarad |
| | 48: | 0.1 microfarad |
| | 262: | 0.022 microfarad |
| | 268: | 4700 picofarad |
| Inductor | 24: | 50 millihenry |
| | 30: | 1.2 millihenry |

TRANSFORMER 45:
Core: Stud core, 12×60 mm., N27 material, or U-U core, 52×35 mm.
Winding 45a: 160 microhenry inductance; leakage inductance measured with winding 45b shorted is 115 microhenry.
Winding 45b: 200 microhenry inductance; leakage inductance measured with winding 45a shorted is 145 microhenry.

Winding 45c: one-twelfth the number of turns of winding 45b.

TRANSFORMER 26:
Same as transformer 26 of FIG. 1.
What is claimed is:

1. A regulated deflection circuit, comprising: a deflection circuit comprising a deflection winding and deflection switching means coupled to said deflection winding for forming first and second deflection intervals;
   first and second resonant energy circuits;
   supply means coupled to said first and second resonant energy circuits for storing energy in said first and second resonant energy circuits;
   deflection circuit energy transfer means coupled to said deflection circuit and to at least one of said first and second resonant energy circuits for transferring energy to said deflection circuit;
   first means coupled to said first and second resonant circuits for transferring energy between said first and second resonant circuits;
   first and second switches coupled respectively to said first and second resonant circuits for generating resonant oscillations in said first and second resonant circuits; and
   control means coupled to said first and second switches and responsive to an energy level of said deflection circuit, for controlling the conduction of said first and second switches, the conduction angle overlap of said first and second switches controlling the energy transfer to said deflection circuit.

2. A regulation deflection circuit, comprising:
   a source of unregulated energy;
   first and second capacitors serially coupled to said source for storing energy from said source;
   a flyback transformer, including a first winding serially coupled with said first capacitor;
   a deflection circuit, including a trace switch coupled to a second winding of said flyback transformer;
   a second transformer, including a first winding coupled to said first capacitor and a second winding coupled to said second capacitor for respectively forming first and second resonant circuits, said first and second windings of said second transformer loosely coupled to each other magnetically for providing a substantial leakage inductance for limiting the energy transfer between said first and second resonant circuits;
   first and second switches respectively coupled to said first and second resonant circuit for respectively producing first and second resonant oscillations in said first and second circuits for transferring energy between said first and second resonants circuits and said deflection circuit; and
   control means coupled to said first and second switches for controlling the conduction of said first and second switches, said control means responsive to an energy level of said deflection circuit for varying the conduction overlap of said first and second resonant oscillations.

3. A regulated deflection system, comprising:
   a source of energy;
   first and second resonant circuits coupled to said source for storing energy from said source;
   a first transformer magnetically coupling said first and second resonant circuits for transferring energy between said first and second resonant circuits;

a flyback transformer, said first resonant circuit coupled to a first winding of said flyback transformer;

a deflection circuit coupled to a second winding of said flyback transformer for transferring energy to said deflection circuit from said first resonant circuit; and first and second switching means respectively coupled to said first and second resonant circuits for generating resonant oscillations in each of said first and second resonant circuits, the conduction angle overlap of said resonant oscillations controlling the amount of energy transfer to said deflection circuit.

4. A system according to claim 3, including a regulator control circuit responsive to an energy level of said deflection system for providing a turn-on signal to said second switching means at a variable instant within a trace interval for varying said conduction angle overlap.

5. A system according to claim 4, including a second control circuit for providing a turn-on signal to said first switching means for turning on said first switching means at the beginning of a retrace interval.

6. A system according to claim 5 wherein said second control circuit includes a winding of said first transformer for providing said turn-on signal to said first switching means before the beginning of said retrace interval, and includes a third winding of said flyback transformer coupled to said second control circuit for disabling said turn-on signal until the beginning of said retrace interval.

7. A system according to claim 3, including a regulator control circuit responsive to an energy level of said deflection system for providing a turn-on signal to said first switching means at a variable instant within a retrace interval for varying said conduction angle overlap.

8. A system according to claim 7, including a second control circuit coupled to said second switching means for turning on said second switching means at a fixed instant within a trace interval.

9. A system according to claim 3 wherein said first resonant circuit includes a first capacitor series coupled with said first winding.

10. A system according to claim 9, including a storage capacitor coupled to a first terminal of said second winding and a trace switch of said deflection circuit coupled to a second terminal of said second winding.

11. A system according to claim 10, including a high voltage winding of said flyback transformer for providing an ultor voltage.

12. A system according to claim 3, including fault sensing means coupled to said second winding for sensing shortcircuiting of said first switching means.

13. A system according to claim 12 wherein said fault sensing means comprises a current sensing impedance in series with said second winding.

* * * * *